United States Patent
Wood

(10) Patent No.: US 6,696,874 B2
(45) Date of Patent: Feb. 24, 2004

(54) SINGLE-EVENT UPSET IMMUNE FLIP-FLOP CIRCUIT

(75) Inventor: Neil E. Wood, Centreville, VA (US)

(73) Assignee: BAE Systems, Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 10/201,100

(22) Filed: Jul. 23, 2002

(65) Prior Publication Data

US 2004/0017237 A1 Jan. 29, 2004

(51) Int. Cl.[7] .............................................. H03K 3/356
(52) U.S. Cl. ........................ 327/210; 327/208; 327/256
(58) Field of Search ................................ 327/256, 209, 327/206, 207, 208, 197, 198, 258; 326/58, 82, 83, 85, 87; 365/156, 233

(56) References Cited

U.S. PATENT DOCUMENTS 5,111,429 A * 5/1992 Whitaker .................... 365/156
6,111,446 A * 8/2000 Keeth ......................... 327/258
6,327,176 B1 * 12/2001 Li et al. ...................... 365/156
6,377,512 B1 * 4/2002 Hamamoto et al. ......... 365/233

* cited by examiner

Primary Examiner—Tuan T. Lam
Assistant Examiner—Hiep Nguyen
(74) Attorney, Agent, or Firm—Daniel J. Long; Antony P. Ng; Bracewell & Patterson, L.L.P.

(57) ABSTRACT

A single-event upset immune flip-flop circuit is disclosed. The single-event upset immune flip-flop circuit includes a first single-event upset immune latch and a second single-event upset immune latch. The first single-event upset immune latch has two inputs and two outputs. The second single-event upset immune latch also has two inputs and two outputs. The two inputs of the second single-event upset immune latch is connected to the two outputs of the first single-event upset immune latch. The state of the first single-event upset immune latch changes only when the signal polarities at both inputs of the first single-event upset immune latch are identical. Similarly, the state of the second single-event upset immune latch changes only when the signal polarities at both inputs of the second single-event upset immune latch are identical.

7 Claims, 4 Drawing Sheets

SINGLE-EVENT UPSET IMMUNE FLIP-FLOP CIRCUIT

RELATED PATENT APPLICATION

The present patent application is related to a copending application U.S. Ser. No. 10/201,045, filed on even date.

BACKGROUND OF THE INVENTION

1. Technical Field

The present invention relates to electronic circuits in general, and in particular to flip-flop circuits. Still more particularly, the present invention relates to a single-event upset immune flip-flop circuit.

2. Description of the Related Art

Flip-flop circuits are widely found in digital circuits because flip-flop circuits are one of the most commonly used elements to implement sequential circuits. Sequential circuits are circuits in which a primary output relies not only on the current value of an input, but also the previous input value. A flip-flop circuit can be used to generate a steady state output signal having either a logical high potential (one) or a logical low (zero) potential.

Referring now to the drawings and, in particular, to FIG. 1, there is depicted a schematic diagram of a flip-flop circuit according to the prior art. As shown, a flip-flop circuit 10 includes a p-channel transistor 15 and three n-channel transistors 16–18 connected in series between a high potential 11 and a ground potential 12, a p-channel transistor 19 and three n-channel transistors 20–22 connected in series between high potential 10 and ground potential 12, three inverters 13, p-channel transistors 23–24, and a latch 14. Inverters 13 are coupled in series between a clock signal input 25 and the gate of transistor 18. Clock signal input 25 is also connected to the gates of transistors 15, 16 and 20. The complement of clock signal input 25 is connected to the gates of transistors 18, 22 and 24. A data input 26 is connected to the gates of transistors 17 and 23. A node 27, which is located between transistors 15 and 16, is connected to the gates of transistors 19 and 21. Transistors 23 and 24 are connected between high potential 10 and node 27. Latch 14 is connected to node 28 located between transistors 19 and 20 to provide an output 29.

During operation, when clock signal CK at clock signal input 25 is at a logical low state, node 27 is precharged to a logical high state, and transistors 18, 22 are turned on, while transistors 16, 20 are turned off. At this point, node 28 holds its value from a previous clock cycle. On the rising edge of clock signal CK at clock signal input 25, transistor 15 is turned off and transistors 16, 20 are turned on. Transistors 18, 22 remain turned on for the delay period of inverters 13. Data D at data input 26 is sampled during this period. If data D at data input 26 is at a logical low state, node 27 remains at a logical high state, and node 28 either remains at a logical low state or is pulled to a logical low state through transistors 20–22. If data D at data input 26 is at a logical high, node 27 is discharged to a logical low state through transistors 16–18, and node 28 remains at a logical high state or is pulled up to a logical high state through transistor 19.

One problem with prior art flip-flop circuits, such as flip-flop circuit 10, is that they are very susceptible to single-event upsets (SEUs) or single-event transients (SETs). For example, if there is an SEU occurred on the data input path, then runt pulses may occur on the data path and subsequently erroneous data occur at the output. Consequently, it is desirable to provide an SEU immune flip-flop circuit.

SUMMARY OF THE INVENTION

In accordance with a preferred embodiment of the present invention, a single-event upset immune flip-flop circuit includes a first single-event upset immune latch and a second single-event upset immune latch. The first single-event upset immune latch has two inputs and two outputs. The second single-event upset immune latch also has two inputs and two outputs. The two inputs of the second single-event upset immune latch is connected to the two outputs of the first single-event upset immune latch. The state of the first single-event upset immune latch changes only when the signal polarities at both inputs of the first single-event upset immune latch are identical. Similarly, the state of the second single-event upset immune latch changes only when the signal polarities at both inputs of the second single-event upset immune latch are identical.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

Figure 1:
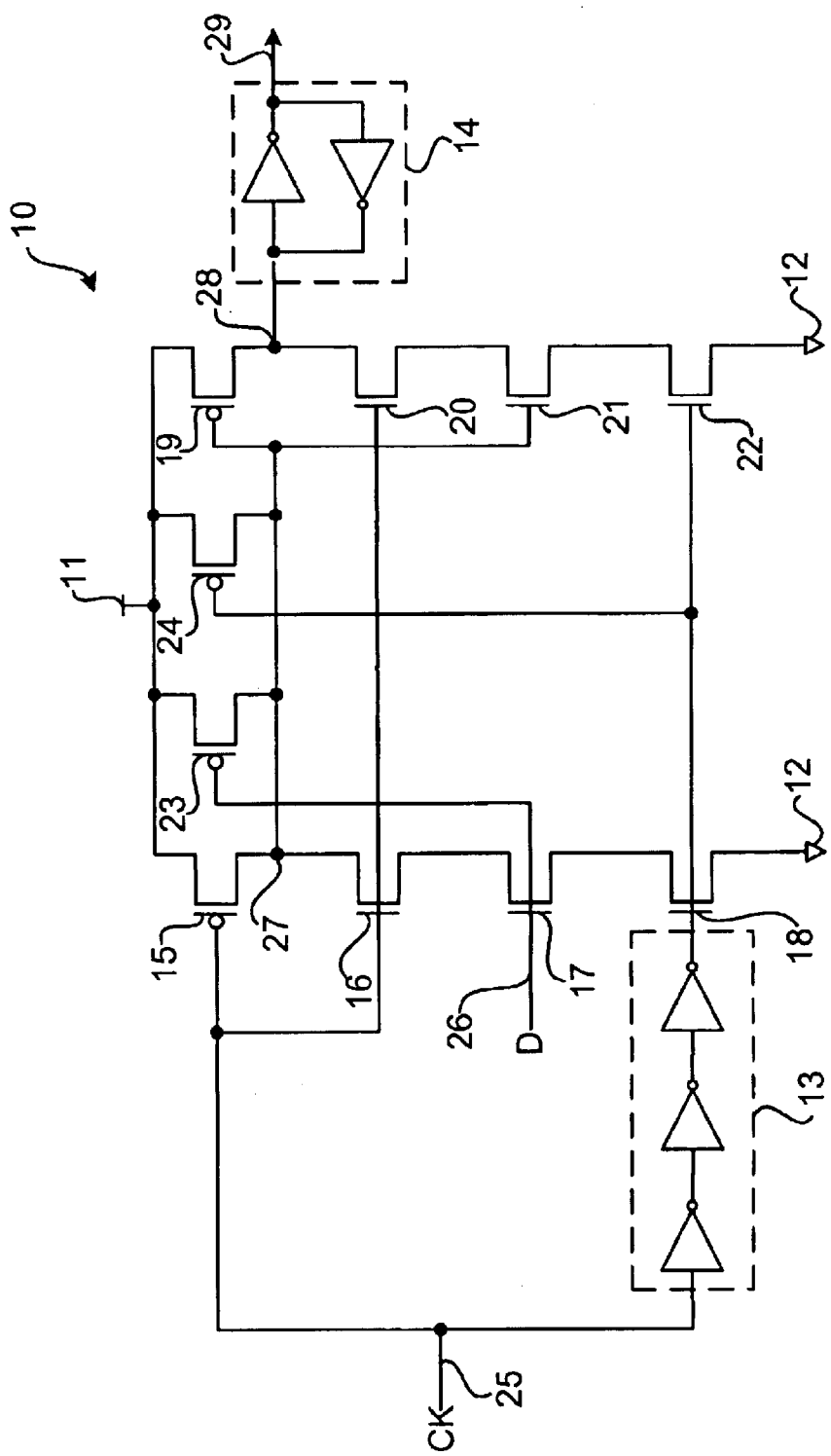
FIG. 1 is a schematic diagram of a flip-flop circuit according to the prior art.
Figure 2:
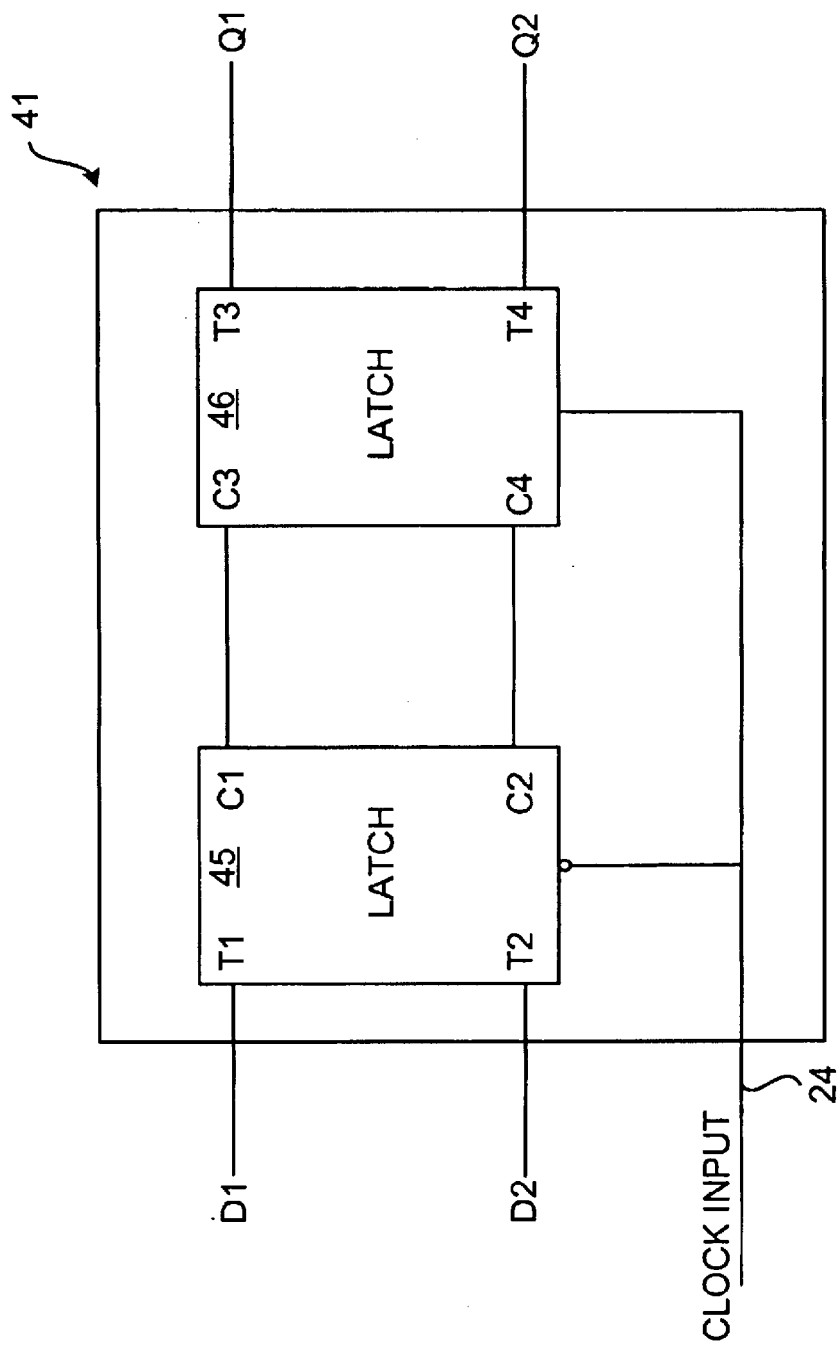
FIG. 2 is a block diagram of a single-event upset (SEU) immune flip-flop circuit, in accordance with a preferred embodiment of the present invention.

With reference now to FIG. 2, there is depicted a block diagram of a dual-path flip-flop (DFF) circuit, in accordance with a preferred embodiment of the present invention. As shown, a DFF circuit 41 includes a single-event upset (SEU) immune latch 45 and an SEU immune latch 46. SEU immune latch 45 has two inputs T1, T2 and two outputs C1, C2. Similarly, SEU immune latch 46 has two inputs C3, C4 and two outputs T3, T4. Inputs T1, T2 of SEU immune latch 45 provide for inputs D1, D2 of DFF circuit 41. Each of outputs C1, C2 of SEU immune latch 45 is connected to a respective one of inputs C3, C4 of SEU immune latch 46. Outputs T3, T4 of SEU immune latch 46 provide for outputs Q1, Q2 of DFF circuit 41. A common clock is provided to SEU immune latch 45 and SEU immune latch 46 via a clock input 24. The state of SEU immune latch 45 changes only when the signal polarities at inputs T1, T2 of SEU immune latch 45 are identical. Similarly, the state of SEU immune latch 46 changes only when the signal polarities at inputs C3, C4 of SEU immune latch 46 are identical. As a result, the state of DFF circuit 41 changes only when the signal polarities at inputs D1, D2 of DFF circuit 41 are identical.

Figure 3:
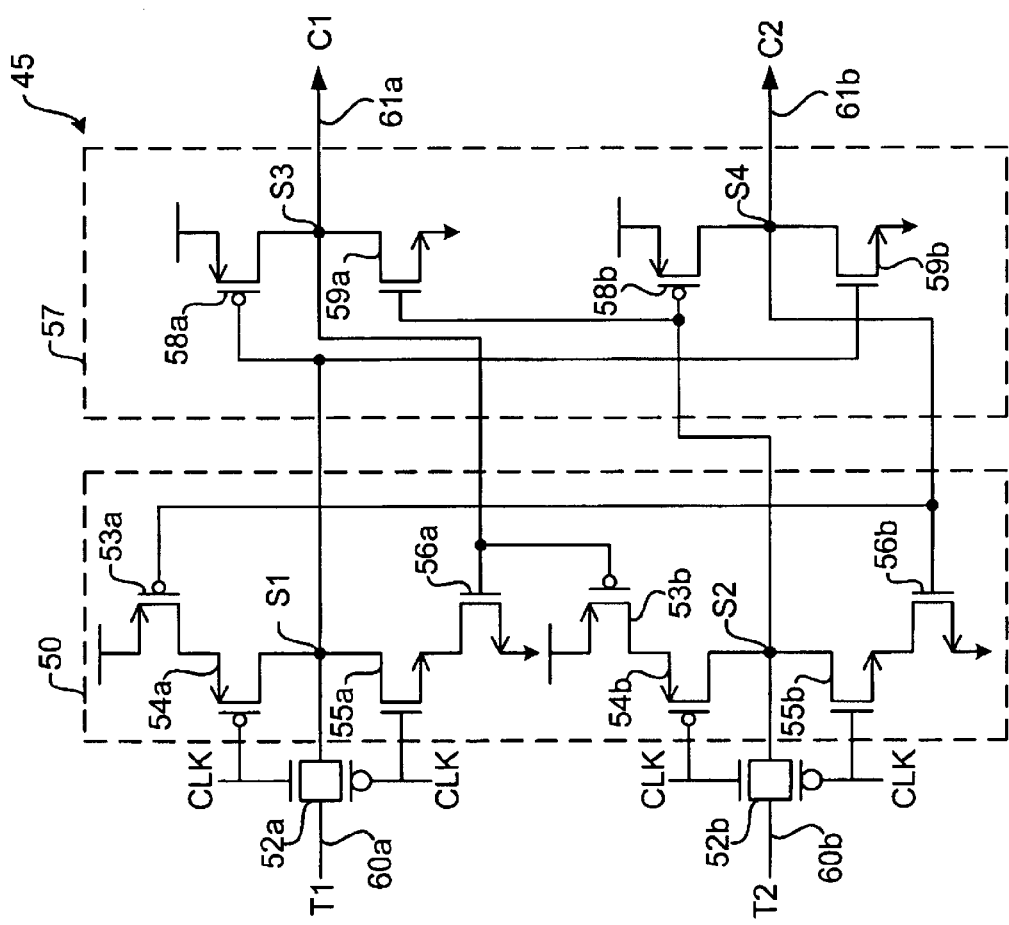
FIG. 3 is a schematic diagram of a first SEU immune latch within the SEU immune flip-flop circuit from FIG. 2, in accordance with a preferred embodiment of the present invention.

Referring now to FIG. 3, there is depicted a schematic diagram of SEU immune latch 45 from FIG. 2, in accordance with a preferred embodiment of the present invention. As shown, SEU latch 45 includes a cross-coupled tri-state inverter 50 and a cross-coupled inverter 57. Cross-coupled tri-state inverter 50 includes a first tri-state inverter connected to a second tri-state inverter in a cross-coupled fashion. The first tri-state inverter includes two serially connected p-channel transistors 53a–54a connected in series with two serially connected n-channel transistors 55a–56a. Similarly, the second tri-state inverter includes two serially connected p-channel transistors 53b–54b connected in series with two serially connected n-channel transistors 55b–56b. The gate of transistor 56a is connected to the gate of transistor 53b to provide a first feedback input for cross-coupled tri-state inverter 50, and the gate of transistor 53a is connected to the gate of transistor 56b to provide a second feedback input for cross-coupled tri-state inverter 50. The first forward input for cross-coupled tri-state inverter 50 is from the gate of transistor 54a and the gate of transistor 55a. The second forward input for cross-coupled tri-state inverter 50 is from the gate of transistor 54b and the gate of transistor 55b.

Cross-coupled inverter 57 includes a first inverter connected to a second inverter in a cross-coupled fashion. The first inverter includes a p-channel transistor 58a connected in series with an n-channel transistor 59a. Similarly, the second inverter includes a p-channel transistor 58b connected in series with an n-channel transistor 59b. The gate of transistor 58a is connected to the gate of transistor 59b to provide a first forward input for cross-coupled inverter 57, and the gate of transistor 59a is connected to the gate of transistor 58b to provide a second forward input for cross-coupled inverter 57. A first output 61a of cross-coupled inverter 57 is provided at a node S3 between transistor 58a and transistor 59a. A second output 61b of cross-coupled inverter 57 is provided at a node S4 between transistor 58b and transistor 59b.

Cross-coupled inverter 57 is connected to cross-coupled tri-state inverter 50. Specifically, first output of cross-coupled inverter 57 (i.e., node S3) is fed back to the first feedback input of cross-coupled tri-state inverter 50 (i.e., the gates of transistors 56a and 53b). Also, second output 61b of cross-coupled inverter 57 (i.e., node S4) is fed back to the second feedback input of cross-coupled tri-state inverter 50 (i.e., the gates of transistors 53a and 56b).

During operation, data enter through an input 60a. A transmission gate 52a allows data to enter cross-coupled tri-state inverter 50 when the clock signal CLK at clock input 24 (from FIG. 2) is at a logical low state. Concurrently, data also enter through an input 60b. A transmission gate 52b allows data to enter cross-coupled tri-state inverter 50 when the clock signal CLK at clock input 24 is at a logical low state.

Since transistors 54a–55a and transistors 54b–55b are turned off when clock signal CLK is at a logical low state, data from input 60a are sent to a storage node S1 (i.e., the first forward input of cross-coupled inverter 57), and data from input 60b are sent to a storage node S2 (i.e., the second forward input of cross-coupled inverter 57). If the data at input 60a and input 60b are both, for example, logical "1's," then transistors 59a and 59b are turned on such that a logical "0" is showed up at both outputs 61a and 61b. If the signals at inputs 60a and 60b are both, for example, logical "1's," then transistors 59a and 59b are turned on such that logical "0's" show up at both output 61a and output 61b. Nodes S3 and S4, at outputs 61a and 61b, respectively, are considered as inverting nodes.

When the clock signal CLK at clock input 24 is at a logical high state, then DFF circuit 41 holds the data from a previous cycle. For example, if nodes S1 and S2 are both at logical "1's" at the previous cycle, that means nodes S3 and S4 are both at logical "0's" at the previous cycle. The logical "0's" from nodes S3 and S4 are also sent to the first feedback input of cross-coupled tri-state inverter 50 (i.e., the gates of transistors 56a and 53b) and the second feedback input of cross-coupled tri-state inverter 50 (i.e., the gates of transistors 53a and 56b), respectively. The logical "0" from node S3 turns on transistor 53b; thus, the logical "1" at node S2 is maintained. The logical "0" from node S4 turns on transistor 53a; thus, the logical "1" at node S1 is maintained.

On the other hand, if nodes S1 and S2 are both at logical "0's" at the previous cycle, that means nodes S3 and S4 are both at logical "1's" at the previous cycle. The logical "1's" from nodes S3 and S4 are also sent to the first feedback input of cross-coupled tri-state inverter 50 and the second feedback input of cross-coupled tri-state inverter 50, respectively. The logical "1" from node S3 turns on transistor 56a; thus, the logical "0" at node S1 is maintained. The logical "1" from node S4 turns on transistor 56b; thus, the logical "0" at node S2 is maintained.

When writing to nodes S1 and S2, if the signal at input 60a is a logical "1" and the signal at input 60b is a logical "0" (or vice versa) due to an incident of single-effect upset, then the inadvertently written state will not be held when clock signal CLK becomes high. For example, if node S1 is at logical "1," node S2 is at logical "1," node S3 is at logical "0," and node S4 is at logical "0" before a write cycle. Due to an SEU, a logical "1" is written to node S1 and a logical "0" is written to node S2, which leads node S3 being the same state and node S4 will be at logical "0" or "1." The logical "0" from node S3 turns on transistor 53b and node S2 will be changed to logical "1". The logical "1" from node S4 turns on transistor 56b, and node S2 will be changed to logical "0" at node S2.

Figure 4:
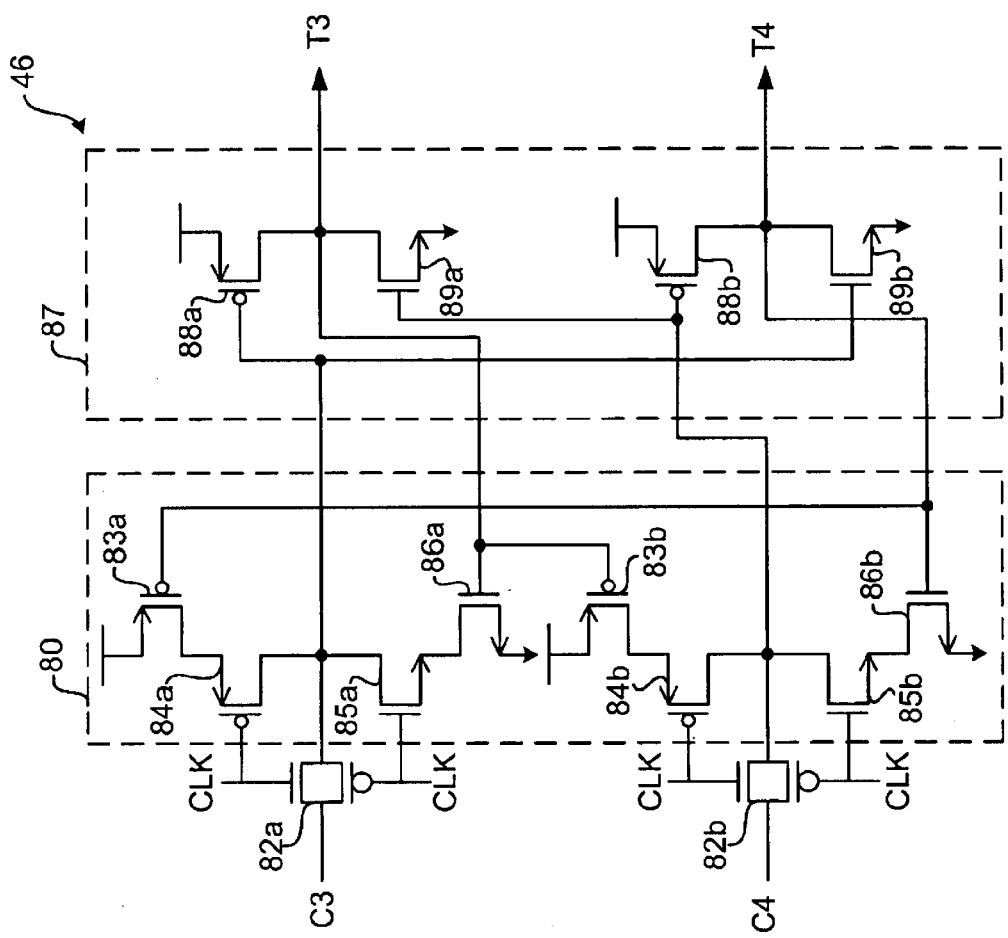
FIG. 4 is a schematic diagram of a second SEU immune latch within the SEU immune flip-flop circuit from FIG. 2, in accordance with a preferred embodiment of the present invention.

With reference now to FIG. 4, there is depicted a schematic diagram of SEU immune latch 46 from FIG. 2, in accordance with a preferred embodiment of the present invention. As shown, SEU latch 46 includes a cross-coupled tri-state inverter 80 and a cross-coupled inverter 87. Cross-coupled tri-state inverter 80 includes a first tri-state inverter connected to a second tri-siate inverter in a cross-coupled fashion. The first tri-state inverter includes two serially connected p-channel transistors 83a–84a connected in series with two serially connected n-channel transistors 85a–86a. Similarly, the second tri-state inverter includes two serially connected p-channel transistors 83b–84b connected in series with two serially connected n-channel transistors 85b–86b. The gate of transistor 86a is connected to the gate of transistor 83b to provide a first feedback input for cross-coupled tri-state inverter 80, and the gate of transistor 83a is connected to the gate of transistor 86b to provide a second feedback input for cross-coupled tri-state inverter 80. The first forward input for cross-coupled, tri-state inverter 80 is from the gate of transistor 84a and the gate of transistor 85a. The second forward input for cross-coupled tri-state inverter 80 is from the gate of transistor 84b and the gate of transistor 85b.

Cross-coupled inverter 87 includes a first inverter connected to a second inverter in a cross-coupled fashion. The first inverter includes a p-channel transistor 88a connected in series with an n-channel transistor 89a. Similarly, the second inverter includes a p-channel transistor 88b connected in series with an n-channel transistor 89b. The gate of transistor 88a is connected to the gate of transistor 89b to provide a first forward input for cross-coupled inverter 87, and the gate of transistor 89a is connected to the gate of transistor 88b to provide a second forward input for cross-coupled inverter 87.

Cross-coupled tri-state inverter 80 is identical to cross-coupled tri-state inverter 50 from FIG. 3, and cross-coupled inverter 87 is identical to cross-coupled inverter 57 from FIG. 3. The main difference between SEU latch S4 and SEU latch 45 is the clock input to the transmission gates. For SEU latch 45, transmission gate 52a allows data to enter cross-coupled tri-state inverter 50 when the clock signal CLK at clock input 24 (from FIG. 2) is at a logical high state, and transmission gate 52b allows data to enter cross-coupled tri-state inverter 50 when the clock signal CLK at clock input 24 is at a logical high state. For SEU latch 46, transmission gate 82a allows data to enter cross-coupled tri-state inverter 80 when the clock signal CLK at clock input 24 is at a logical high state, and transmission gate 82b allows data to enter cross-coupled tri-state inverter 80 when the clock signal CLK at clock input 24 is at a logical high state.

As has been described, the present invention provides an SEU immune flip-flop circuit.

While the invention has been particularly shown and described with reference to a preferred embodiment, it will be understood by those skilled in the art that various changes in form and detail may be made therein without departing from the spirit and scope of the invention.

What is claimed is:

1. A single-event upset immune latch circuit, comprising:
   a first dual-input inverter for receiving a first input to provide a first intermediate output, wherein said first dual-input inverter includes two p-channel transistors and two n-channel transistors connected in series;
   a second dual-input inverter for receiving a second input to provide a second intermediate output, wherein said second dual-input inverter includes two p-channel transistors and two n-channel transistors connected in series;
   a first inverter for receiving said first and second intermediate outputs from said first and second dual-input inverters to provide a first output, wherein said first inverter includes a p-channel transistor and an n-channel transistor connected in series; and
   a second inverter for receiving said first and second intermediate outputs from said first and second dual-input inverters to provide a second output, wherein said second inverter includes a p-channel transistor and an n-channel transistor connected in series.

2. The single-event upset immune latch circuit of claim 1, wherein
   said first intermediate output is connected to said p-channel transistor of said first inverter and said n-channel transistor of said second inverter; and
   said second intermediate output is connected to said n-channel transistor of said first inverter and said p-channel transistor of said second inverter.

3. The single-event upset immune latch circuit of claim 1, wherein
   said first output is also connected to one of said two n-channel transistors of said first dual-input inverter and one of said two p-channel transistors of said second dual-input inverter; and
   said second output is also connected to one of said two p-channel transistors of said first dual-input inverter and one of said two n-channel transistors of said second dual-input inverter.

4. The single-event upset immune latch circuit of claim 1, wherein
   said first input is coupled to said first dual-input inverter via a first set of pass gates; and
   said second input is coupled to said second dual-input inverter via a second set of pass gates.

5. A single-event upset immune flip-flop circuit comprising:
   a first single-event upset immune latch having two inputs and two outputs, wherein a state of said first single-event upset immune latch changes only when signal polarities at said two inputs of said first single-event upset immune latch are identical, wherein said first single-event upset immune latch includes:
      a first dual-input inverter for receiving a first one of said two inputs of said first single-event upset immune latch to provide a first intermediate output, wherein said first dual-input inverter includes two p-channel transistors and two n-channel transistors connected in series;
      a second dual-input inverter for receiving a second one of said two inputs of said first single-event upset immune latch to provide a second intermediate output, wherein said second dual-input inverter includes two p-channel transistors and two n-channel transistors connected in series;
      a first inverter for receiving said first and second intermediate outputs from said first and second dual-input inverters to provide a first output, wherein said first inverter includes a p-channel transistor and an n-channel transistor connected in series; and
      a second inverter for receiving said first and second intermediate outputs from said first and second dual-input inverters to provide a second output, wherein said second inverter includes a p-channel transistor and an n-channel transistor connected in series; and
   a second single-event upset immune latch having two inputs and two outputs, wherein each of said two inputs of said second single-event upset immune latch is connected to a respective one of said two outputs of said first single-event upset immune latch, wherein a state of said second single-event upset immune latch changes only when signal polarities at said two inputs of said second single-event upset immune latch are identical, wherein said second single-event upset immune latch includes:
      a third dual-input inverter for receiving a first one of said two inputs of said second single-event upset immune latch to provide a third intermediate output, wherein said first dual-input inverter includes two p-channel transistors and two n-channel transistors connected in series;
      a fourth dual-input inverter for receiving a second one of said two inputs of said second single-event upset immune latch to provide a fourth intermediate output, wherein said second dual-input inverter includes two p-channel transistors and two n-channel transistors connected in series;
      a third inverter for receiving said third and fourth intermediate outputs from said third and fourth dual-input inverters to provide a third output, wherein said third inverter includes a p-channel transistor and an n-channel transistor connected in series; and
      a fourth inverter for receiving said third and fourth intermediate outputs from said third and fourth dual-input inverters to provide a fourth output, wherein said fourth inverter includes a p-channel transistor and an n-channel transistor connected in series.

6. The single-event upset immune latch circuit of claim 5, wherein said first intermediate output is connected to said p-channel transistor of said first inverter and said n-channel transistor of said second inverter;

said second intermediate output is connected to said n-channel transistor of said first inverter and said p-channel transistor of said second inverter;

said third intermediate output is connected to said p-channel transistor of said third inverter and said n-channel transistor of said fourth inverter; and said fourth intermediate output is connected to said n-channel transistor of said third inverter and said p-channel transistor of said fourth inverter.

7. The single-event upset immune latch circuit of claim 5, wherein said first output is also connected to one of said two n-channel transistors of said first dual-input inverter and one of said two p-channel transistors of said second dual-input inverter;

said second output is also connected to one of said two p-channel transistors of said first dual-input inverter and one of said two n-channel transistors of said second dual-input inverter;

said third output is also connected to one of said two n-channel transistors of said third dual-input inverter and one of said two p-channel transistors of said fourth dual-input inverter; and said fourth output is also connected to one of said two p-channel transistors of said third dual-input inverter and one of said two n-channel transistors of said fourth dual-input inverter.

* * * * *